United States Patent
Bevelacqua et al.

(10) Patent No.: US 9,774,085 B2
(45) Date of Patent: Sep. 26, 2017

(54) CO-LOCATED NFC READER

(71) Applicant: Google Inc., Mountain View, CA (US)

(72) Inventors: Peter Bevelacqua, Mountain View, CA (US); Jason Chamberlain, Campbell, CA (US)

(73) Assignee: Google Inc., Mountain View, CA (US)

( * ) Notice: Subject to any disclaimer, the term of this patent is extended or adjusted under 35 U.S.C. 154(b) by 86 days.

(21) Appl. No.: 14/717,172

(22) Filed: May 20, 2015

(65) Prior Publication Data

US 2016/0344102 A1   Nov. 24, 2016

(51) Int. Cl.
| | |
|---|---|
| *H05K 3/32* | (2006.01) |
| *H01Q 7/00* | (2006.01) |
| *H01Q 1/38* | (2006.01) |
| *H05K 1/02* | (2006.01) |
| *H04B 5/00* | (2006.01) |

(52) U.S. Cl.
CPC ............ *H01Q 7/00* (2013.01); *H01Q 1/38* (2013.01); *H04B 5/0081* (2013.01); *H05K 1/0296* (2013.01); *H05K 3/32* (2013.01); *H04B 5/0056* (2013.01); *H05K 2201/09063* (2013.01); *H05K 2201/09972* (2013.01); *H05K 2201/10098* (2013.01)

(58) Field of Classification Search
None
See application file for complete search history.

(56) References Cited

U.S. PATENT DOCUMENTS

| | | | |
|---|---|---|---|
| 8,436,780 | B2 | 5/2013 | Schantz et al. |
| 9,123,979 | B1 * | 9/2015 | Izadian ............... H01P 3/18 |
| 2010/0170953 | A1 * | 7/2010 | Schaade ............ H05K 1/0266 |
| | | | 235/492 |
| 2012/0255763 | A1 * | 10/2012 | Baek ............... G06K 19/07722 |
| | | | 174/250 |
| 2013/0078917 | A1 | 3/2013 | Cho et al. |
| 2013/0341414 | A1 | 12/2013 | Ziller et al. |
| 2014/0002313 | A1 | 1/2014 | Yang et al. |
| 2014/0092543 | A1 | 4/2014 | Yang et al. |
| 2014/0176372 | A1 | 6/2014 | Liao et al. |

OTHER PUBLICATIONS

Extended European Search Report received in European patent application No. 16170230.3 on Nov. 7, 2016 (5 pages).
Rule 71(3) dated Jul. 28, 2017 as received in EP Application No. 16170230.3.

* cited by examiner

*Primary Examiner* — Courtney Smith
*Assistant Examiner* — Jessey R Ervin
(74) *Attorney, Agent, or Firm* — Morris & Kamlay LLP

(57) ABSTRACT

Systems and techniques are provided for a co-located NFC reader. A top conductive layer may include an inner PCB section, including a circuit for an electronic device, and an outer PCB section, including a near-field communications (NFC) chipset, separated by a gap in which an NFC antenna connected to the NFC chipset may be located. A substrate layer may include an inner PCB section and an outer PCB section separated by the gap. A bridge including a trace may cross the gap. A lower conductive layer may include an inner PCB section, including a circuit for the electronic device electrically connected to the circuit for the electronic device located on the inner PCB section of the top conductive layer, and an outer PCB section, including a circuit for the electronic device, separated by the gap.

20 Claims, 7 Drawing Sheets

CO-LOCATED NFC READER

BACKGROUND

A near field communications (NFC) reader may use a loop antenna. Larger loops may make it easier for the reader to communicate with another NFC-equipped device. An NFC reader may be used to complement other electronic devices, including input devices such as keypads. The printed circuit board (PCB) used for the electronic device may limit the size and possible locations of the NFC antenna and associated NFC chipset, as the NFC antenna may need be placed to avoid interference from metal used in the PCB. The NFC chipset may need to be placed on a separate PCB, increasing the size of a device. The NFC antenna may also be insulated using ferrite, which may increase the cost of a device that includes both the NFC reader and other electronic device.

BRIEF SUMMARY

According to an embodiment of the disclosed subject matter, a top conductive layer may include an inner PCB section and an outer PCB section separated by a gap. A circuit for an electronic device may be located on the inner PCB section of the top conductive layer. A near-field communications (NFC) chipset may be located on the outer PCB section of the top conductive layer. A substrate layer of the PCB may include an inner PCB section and an outer PCB section separated by the gap. A bridge may cross the gap between the inner PCB section of the substrate layer and the outer PCB section of the substrate layer. A lower conductive layer of the PCB may include an inner PCB section and an outer PCB section separated by the gap. A circuit for the electronic device may be located on the inner PCB section of the lower conductive layer and may be electrically connected to the circuit for the electronic device located on the inner PCB section of the top conductive layer. A circuit for the electronic device may be located on the outer PCB section of the lower conductive layer. A trace may be located on the bridge and may electrically connect the circuit for the electronic device disposed on the inner PCB section of the lower conductive layer with the circuit for the electronic device located on the outer PCB section of the lower conductive layer. An NFC antenna may be located in the gap that separates the inner PCB section of the top conductive layer and the outer PCB section of the top conductive layer such that the NFC antenna crosses over the bridge at an angle that is at or near a right angle and may be connected to the NFC chipset to form an NFC reader.

The electronic device may be a keypad, touchscreen, non-touchscreen, fingerprint reader, active infrared sensor, or speaker. The circuit for the electronic device located on the inner PCB section of the top conductive layer may be a contact pad for a keypad. The substrate layer may be a third substrate layer of a multilayer PCB.

The lower conductive layer may be located between the substrate layer and one other substrate layer. The bridge may include material of the substrate layer and the one other substrate layer. The trace may be located on the bridge in between the material of the substrate layer and the one other substrate layer. The outer PCB section of the top conductive layer may include a circuit for the NFC chipset. The circuit for the NFC chipset may include a circuit connected to leads of the NFC antenna. The outer PCB section of the lower conductive layer may include a circuit for the NFC chipset that is electrically connected to the NFC chipset. An additional trace may be located on an additional bridge.

According to an embodiment of the disclosed subject matter, a means for obtaining an NFC antenna, a means for obtaining a multilayer PCB where each layer of the multilayer PCB includes an inner section and an outer section separated by a gap, the top conductive layer of the multilayer PCB includes a circuit for an electronic device, a substrate layer of the multilayer PCB includes a bridge connecting the inner section and outer section of the substrate layer, and a conductive layer of the multilayer PCB includes a trace located on the bridge and electrically connecting the ne circuit for the electronic device on the inner section of the top conductive layer to the other circuit for the electronic device on the outer section of the conductive layer, a means for attaching an NFC chipset to the outer section of the top conductive layer of the multilayer PCB, a means for routing an NFC antenna in the gap between the inner section and the outer section of the top conductive layer of the multilayer PCB such that the angle where NFC antenna intersects the bridge is at or a near a right angle, and a means for attaching the NFC antenna to the NFC chipset to form an NFC reader, are included.

Systems and techniques disclosed herein may allow for a co-located NFC reader. Additional features, advantages, and embodiments of the disclosed subject matter may be set forth or apparent from consideration of the following detailed description, drawings, and claims. Moreover, it is to be understood that both the foregoing summary and the following detailed description are examples and are intended to provide further explanation without limiting the scope of the claims.

BRIEF DESCRIPTION OF THE DRAWINGS

The accompanying drawings, which are included to provide a further understanding of the disclosed subject matter, are incorporated in and constitute a part of this specification. The drawings also illustrate embodiments of the disclosed subject matter and together with the detailed description serve to explain the principles of embodiments of the disclosed subject matter. No attempt is made to show structural details in more detail than may be necessary for a fundamental understanding of the disclosed subject matter and various ways in which it may be practiced.

DETAILED DESCRIPTION

Figure 1:
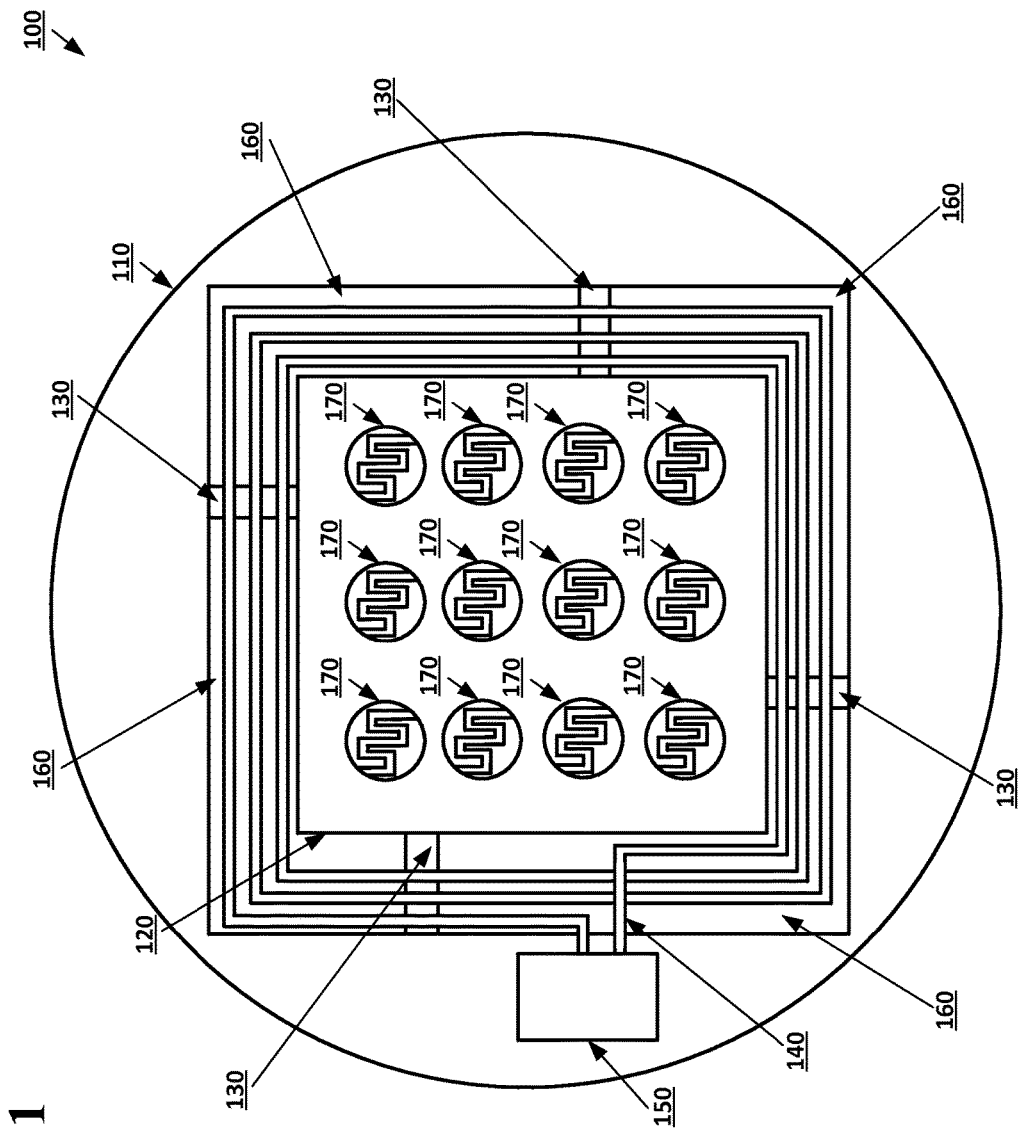
FIG. 1 shows an example top view of a co-located NFC reader according to an implementation of the disclosed subject matter.

According to embodiments disclosed herein, a co-located NFC reader may be co-located on a multilayer PCB with another electronic device. The NFC reader may include an NFC antenna and an NFC chipset. A multilayer PCB for an electronic device may have an inner PCB section and an outer PCB section with a gap in between. The gap may be complete on a top conductive layer of the multilayer PCB, so that the inner PCB section and outer PCB section are not connected on the top conductive layer. The NFC antenna may be arranged in the gap between the inner PCB section and the outer PCB section on the top conductive layer of the multilayer PCB. The NFC antenna may be arranged on a non-conductive or insulating material within the gap, such as plastic, or may be supported by the connection between leads of the NFC antenna and an NFC chipset. The inner PCB section of the top conductive layer may include electronic circuitry and electronics for an electronic device, such as a keypad. The outer PCB section of the top conductive layer may include the NFC chipset for use with the NFC antenna, along with circuitry and electronics for use with the electronic device. A substrate or core layer of the multilayer PCB, between a second conductive layer and a third conductive layer, may include bridges connecting the inner PCB section to the outer PCB section across the gap. The bridges may be arranged at or near right angles to the NFC antenna where the NFC antenna and bridges intersect in the gap. Traces of the third conductive layer of the multilayer PCB may cross the bridges from the inner PCB section to the outer PCB section, connecting the electronic device, and related circuitry and electronics, on the inner PCB section to any circuitry and electronics on the outer PCB section. The multilayer PCB may include additional substrate and conductive layers, which may include additional bridges and traces from the inner PCB section to the outer PCB section, as needed to properly route the traces for the electronic device.

The co-located NFC reader may be co-located with an electronic device on a PCB. The electronic device may be, for example, a keypad, fingerprint scanner, touchscreen, non-touchscreen, active infrared sensor, or other input or output device. The PCB may be a multilayer PCB made using any suitable materials, such as, for example, copper for conductive layers and, fiberglass epoxy resin as a substrate and core material. The PCB may include an inner PCB section and an outer PCB section. The inner PCB section and outer PCB section may each be any suitable size, and may be separated on the top conductive layer of the multilayer PCB by a gap of any suitable dimensions. The outer PCB section may completely enclose the inner PCB section, or may only partially surround the inner PCB section.

The inner PCB section of the top conductive layer may include circuitry for the operation of the electronic device. The circuitry may be the circuitry located directly below the rest of the electronic device. For example, for a keypad, the inner PCB section of the top conductive layer may include circuitry for contact pads for each of the keys on the keypad. The keypad, with physical keys, may be placed on top of the inner PCB section of the top conductive layer, so that pressing a key connects the appropriate circuit broken by a contact pad on the inner PCB section of the top conductive layer.

The NFC antenna of the co-located NFC reader may be arranged in the gap between the inner PCB section of the top conductive layer and the outer PCB section. The gap may be of any suitable size and shape. The gap may completely separate the inner PCB section of the top conductive layer from the outer PCB section of the top conductive layer. The gap may be filled, wholly or partially, by a non-conductive material, such as, for example, plastic, which may provide a base on which the NFC antenna can be mounted. The NFC antenna may be a loop antenna, and may encircle the inner PCB section. There may be no contact between the loop of the NFC antenna and either the inner PCB section or the outer PCB section. The NFC antenna may have any number of loops, and may be made of any suitable material for an antenna for use with NFC communications.

The outer PCB section of the top conductive layer may include the NFC chipset for the co-located NFC reader. The NFC chipset may be located at any suitable location on the outer PCB section of the top conductive layer. The leads from the NFC antenna may be connected to the NFC chipset, crossing the gap from the NFC antenna to the NFC chipset. The leads from the NFC antenna may include traces on the outer PCB section of the top conductive layer, or may be entirely separate from the outer PCB section of the top conductive layer. The leads from the NFC antenna may also support the NFC antenna in the gap if the NFC antenna is not mounted to or resting on a non-conductive material in the gap. Traces carrying electricity, and electrical signals, to and from the NFC to provide power to and data input and output to and from the NFC chipset may be located on the outer PCB section of the top conductive layer, for example, etched in the PCB, or may be routed through other layers of the outer PCB section. The outer PCB section of the top conductive layer may also include circuitry or electronics for use with the electronic device, though such circuitry or electronics may not be connected on the top conductive layer to the circuitry for the electronic device on the inner PCB section. The NFC chipset and NFC antenna may act as an NFC reader.

The second conductive layer of the multilayer PCB may be a conductive layer separated from the top conductive layer by substrate material of a first substrate layer. The second conductive layer may include an inner PCB section and an outer PCB section separated by the gap, similarly to the top conductive layer. The second conductive layer of the multi-layer PCB may include electronics and circuitry for the electronic device on both the inner PCB section and the outer PCB section, which may be connected through traces routed on other layers of the multilayer PCB.

The third conductive layer of the multilayer PCB may be a conductive layer separated from the second conductive layer by a second substrate layer, which may be made of a substrate or core material. The third conductive layer may include an inner PCB section and an outer PCB section. The inner PCB section of the second substrate layer may be connected to the outer PCB section of the second substrate layer by any suitable number of bridges. The bridges may be made of any suitable material, including, for example, the same material as the multilayer PCB, such as the substrate or core material of the second substrate layer. The bridges may be formed out of the multilayer PCB, with the second substrate layer of the multilayer PCB being a continuous piece including the inner PCB section, outer PCB section, and bridges. The bridges may also be separate pieces of material used to connect the inner PCB and outer PCB sections of the third conductive layer. For example, the bridges connecting the inner PCB section of the second substrate layer and the outer PCB section of the second substrate layer may be formed from the material of second substrate layer.

The NFC antenna and bridges may be arranged so that the NFC antenna crosses the bridges at or near a right angle. For example, when the NFC antenna is arranged in the gap of the top conductive layer of the multilayer PCB, the NFC antenna may be routed to ensure that it is at, or near to, a right angle to any bridge of the second substrate layer or other layer which the NFC antenna crosses. The NFC antenna may not have any direct physical contact with any of the bridges, or may rest on or be attached to a non-conductive or insulating portion of a bridge, for example, made from substrate or core material.

The conductive material of the inner and outer PCB sections of the third conductive layer may be connected by traces that cross the bridges. The traces may be formed on the bridges from the conductive material of the third conductive layer. For example, if a bridge is formed from the second substrate layer, the traces that connect the inner and outer PCB sections of the third conductive layer may be formed on the side of the bridge opposite the side which the NFC antenna crosses. If the bridge is formed from the substrate material of a third substrate layer between the third conductive layer and a fourth conductive layer, the traces that connect the inner and outer PCB sections of the third conductive layer may be formed on the side of the bridge which the NFC antenna crosses. The bridge may also be formed from both the substrate or core material of the second substrate layer and the third substrate layer. The traces of the third conductive layer may then be formed in between the substrate or core material of the second substrate layer and the third substrate layers that forms the bridges.

The traces formed on the bridges may be any suitable traces for carrying electricity, and electronic signals, between circuitry and electronics of the electronic device on the various layers of the inner PCB section to circuitry and electronics on the various layers of the outer PCB section. The traces may be routed across the bridges so that they are at a right angle to the NFC antenna in locations where the NFC antenna crosses over a bridge. The outer PCB section may include, on the third conductive layer and other conductive layers, any suitable circuitry and electronics for use with the electronic device on the inner PCB section. For example, the outer PCB section of the third conductive layer and other conductive layers may include circuitry and electronics for receiving output from a keypad mounted on the inner PCB section of the top conductive layer and routing the output to other electronic devices through a wired or wireless connection.

In some implementations, traces may also be formed on bridges that connect the inner PCB section of the second conductive layer to the outer PCB section of the second conductive layer. For example, the bridges may formed from the substrate or core material of the first substrate layer, the second substrate layer, or both. The traces on the second conductive layer may be separated from the NFC antenna at points where the NFC antenna passes over a bridge by an insulating or non-conductive material, such as, for example, the material of the first substrate layer or some other material placed over traces on the second substrate layer. The non-conductive material may be the material in the gap on which the NFC antenna is arranged. For example, the gap may include non-conductive material covering only the bridges between the inner PCB section and the outer PCB section, and the NFC antenna may be arranged and fixed in place by being attached to the non-conducive material that covers the bridges. The remainder of the gap may be, for example, filled with air or another, non-conductive gas, or may be empty, for example, if the gap electronic device and co-located NFC reader are vacuum sealed and airtight.

The multilayer PCB may include additional conductive, substrate, and core layers. Each additional layer of the multilayer PCB may include a layer of the inner PCB section and a layer of the outer PCB section separated by the gap. The additional layers may include additional bridges, arranged between the inner PCB section and outer PCB section so that they are at or near a right angle with the NFC antenna. The additional bridges may include additional traces, as necessary to route electricity, and electronic signals, between the electronic device and other circuitry and electronics on the inner PCB section and circuitry and electronics on the outer PCB section. Bridges on different layers may or may not overlap. The bridges may be arranged across different layers so that they do not substantially fill the gap and the traces crossing the bridges do not form a metal backing behind the NFC antenna. A substantial portion of the NFC antenna loop may not pass over any bridge on any layer of the multilayer PCB.

FIG. 1 shows an example top view of a co-located NFC reader according to an implementation of the disclosed subject matter. A device 100 may be any suitable electronic device with a co-located NFC reader including the NFC chipset 150 and the NFC antenna 140. The device 100 may include a multilayer PCB, with an outer PCB section 110 and an inner PCB section 120 separated by a gap 160. The multilayer PCB may be made of any suitable PCB materials, including, for example, copper, fiberglass, prepreg, and another suitable conductors, insulators, and dielectrics.

A top conductive layer of the multilayer PCB for the device 100 may be made of a conductive material. The inner PCB section 120 of the top conductive layer may include circuitry and electronics for an electronic device. For example, the inner PCB section 120 may include contact pads 170 for a keypad. The outer PCB section 110 of the top conductive layer may include circuitry and electronics for the electronic device which may be connected to the circuitry and electronics for the electronic device on the inner PCB section 120 of the top conductive layer through traces routed through other layers. The outer PCB section 110 may also include the NFC chipset 150 for the co-located NFC reader. The outer PCB section 110 may include traces to the NFC chipset 150 that may carry electricity, and electrical signals, to provide power to and data input and output to and from the NFC chipset 150.

The gap 160 may be in between the inner PCB section 120 and outer PCB section 110 on the top conductive layer and other layers of the multilayer PCB On the top conductive layer, the gap 160 may completely separate the inner PCB section 120 from the outer PCB section 110, as there may be no bridges on the top conductive layer. The gap 160 may be empty, or may be filled wholly or partially with a non-conductive material.

The NFC antenna 140 may be arranged in the gap 160 between the outer PCB section 110 and the inner PCB section 120 on the top conductive layer of the multilayer PCB. The NFC antenna 140 may be made of any suitable material for use as an antenna for an NFC reader, and may be a loop antenna including any suitable number of loops. The NFC antenna 140 may be arranged in the gap 160 so that it does not touch or overlap inner PCB section 120 or the outer PCB section 110 of the top conductive layer, except where the leads from the NFC antenna 140 connect to the NFC chipset 150. The leads of the NFC antenna 140 may be traces etched into the outer PCB section 110, or may be separate from the outer PCB section 110. The NFC antenna 140 may be supported by, and affixed to, non-conductive material in the gap 160, or may be supported by the NFC chipset 150 through the leads of the NFC antenna 140.

The multilayer PCB for the device 100 may include bridges 130 between the inner PCB section 120 and the outer PCB section 110. The bridges 130 may cross the gap 160 on layers of the multilayer PCB other than the top conductive layer. For example, the bridges 130 may be formed from a substrate or core material between conductive layers of the multilayer PCB. For example, the bridges 130 may be formed from substrate or core material of the second substrate layer between the third conductive layer and the second conductive layer, from substrate or core material of the third substrate layer between the third conductive layer and a fourth conductive layer, or both. The bridges 130 may be formed contiguous with and integral to the multilayer PCB for the device 100, or may be separate material added to the multilayer PCB, crossing the gap between the inner PCB section 120 and the outer PCB section 110. The bridges 130 may include traces made of conductive material. The traces may connect, for example, the inner PCB section 120 of the third conductive layer to the outer PCB section 110 of the third conductive layer, so that electricity and electronic signals may cross between the inner PCB section 120 and the outer PCB section 110.

The bridges 130 and the NFC antenna 140 may be at or near right angles to each other where they intersect in the gap 160. For example, the NFC antenna 140 may be routed through the gap 160 so that loops of the NFC antenna 140 pass over any bridges 130 at or near a right angle. The bridges 130 may be on any layer of the multilayer PCB other than the top conductive layer.

Figure 2:
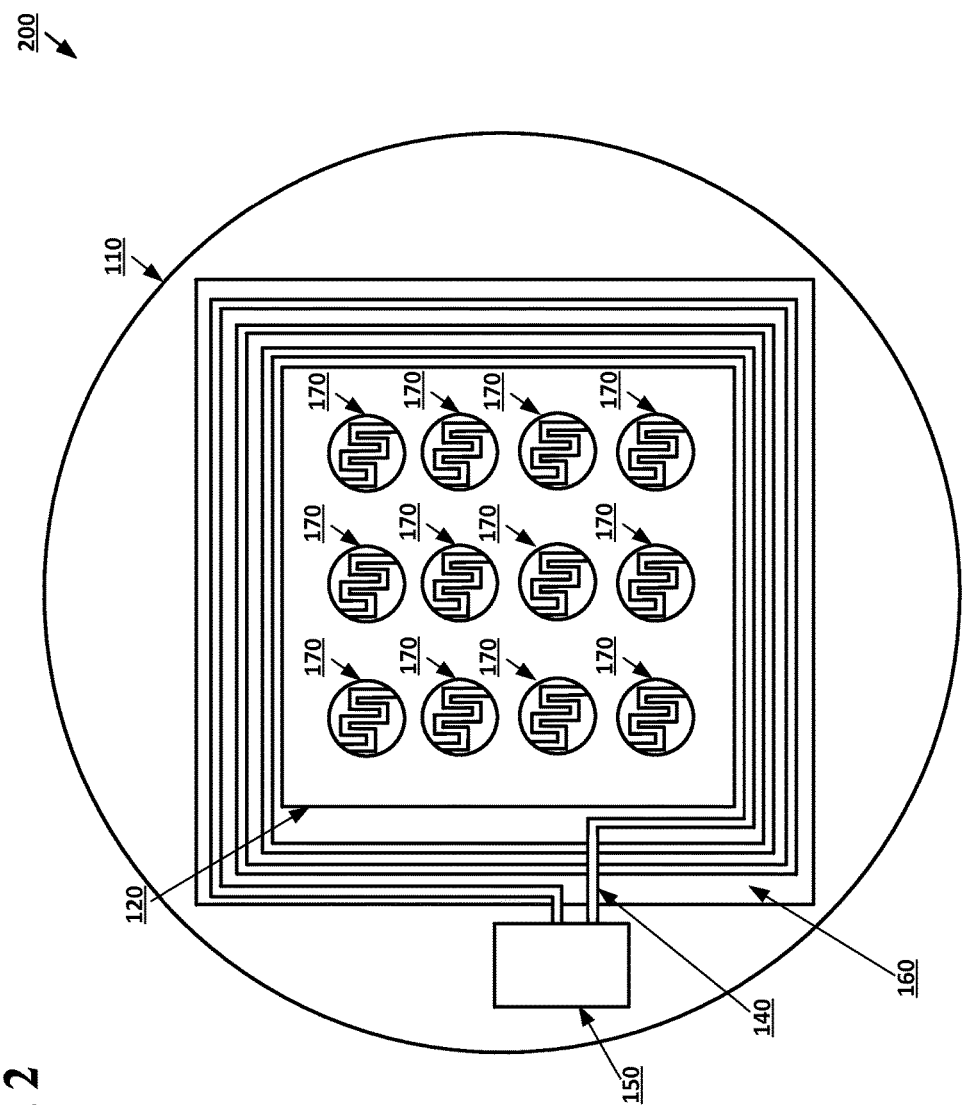
FIG. 2 shows an example top conductive layer view of a co-located NFC reader according to an implementation of the disclosed subject matter.

FIG. 2 shows an example top conductive layer view of a co-located NFC reader according to an implementation of the disclosed subject matter. A top conductive layer 200 of the device 100 may include the co-located NFC reader, including the NFC antenna 140 and the NFC chipset 150, along with electronics and circuitry for an electronic device, such as contact pads 170 for a keypad. The NFC chipset 150 may be located on the outer PCB section 110 of the top conductive layer 200, while the electronics and circuitry for the electronic device, such as the contact pads 170, may be located on the inner PCB section 120. Other electronics and circuitry for the electronic device may also be located on the outer PCB section 110. The top conductive layer 200 may be made from any suitable conductive material for use in a multilayer PCB, such as, for example, copper.

On the top conductive layer 200, the gap 160 may completely separate the inner PCB section 120 from the outer PCB section 110. There may be no traces on the top conductive layer 200 that cross the gap 160. The NFC antenna 140 may be arranged and routed through the gap 160 so that it does not contact or overlap the inner PCB section 120, and only overlaps or contacts the outer PCB section 110 where the leads of the NFC antenna 140 connect to the NFC chipset 150.

Figure 3:
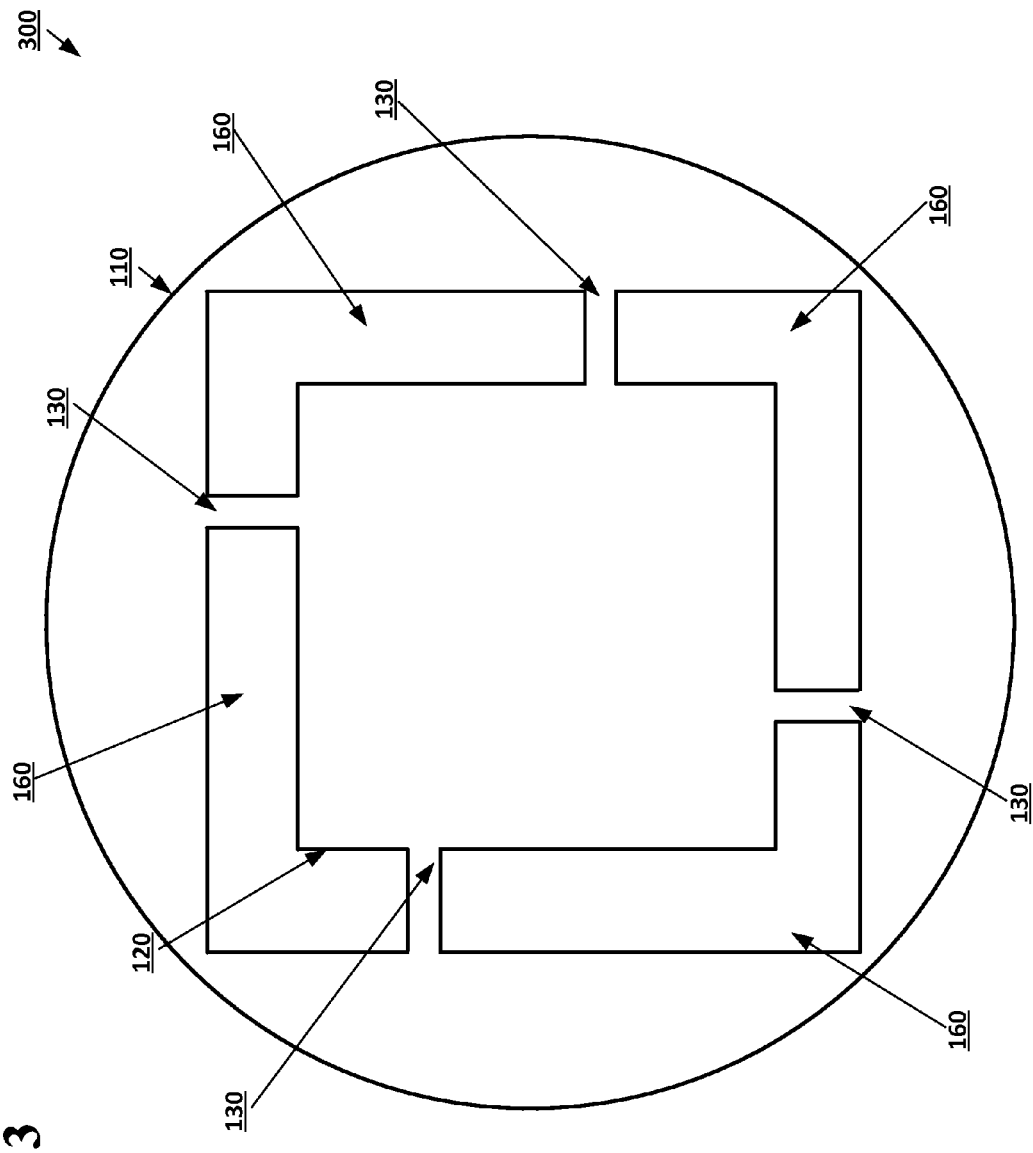
FIG. 3 shows an example substrate view of a co-located NFC reader according to an implementation of the disclosed subject matter.

FIG. 3 shows an example substrate view of a co-located NFC reader according to an implementation of the disclosed subject matter. A third substrate layer 300 may be between a third and fourth conductive layer of the multilayer PCB of the device 100. A first substrate layer may be between the second conductive layer and the top conductive layer 200, and a second substrate layer may between the second and third conductive layers. The third substrate layer 300 may be made from any suitable substrate material for use as a substrate or core in a multilayer PCB, such as, for example, fiberglass epoxy resin. The third substrate layer 300 may include the bridges 130, which may cross the gap between the inner PCB section 120 and the outer PCB section 110. The inner PCB section 120, the outer PCB section 110, and the bridges 130 of the third substrate layer 300 may all be formed from one piece of material, for example, the substrate material of the third substrate layer 300. The bridges 130 may arranged so that the NFC antenna 140 may cross over them at or near right angles.

Figure 4:
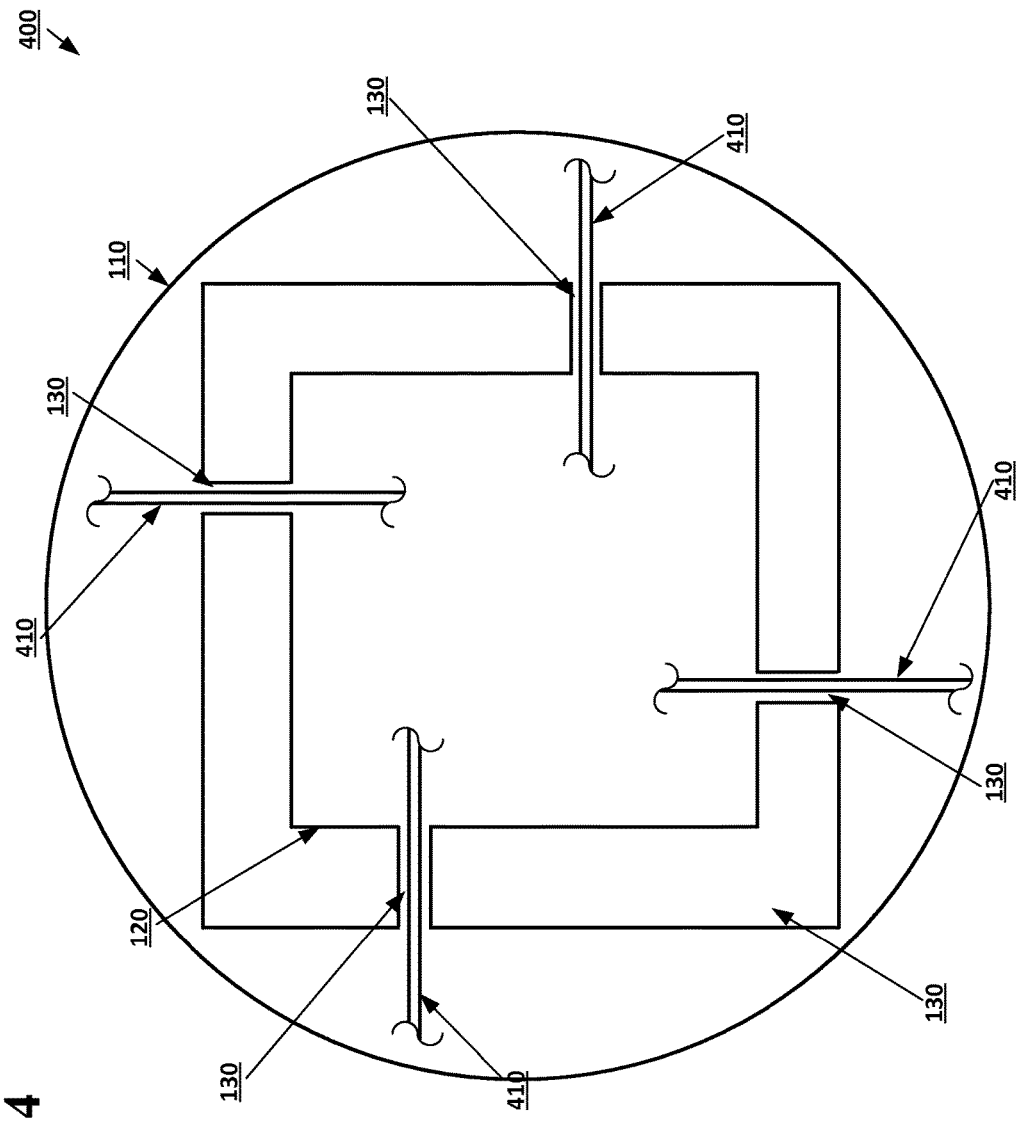
FIG. 4 shows an example third conductive layer and substrate view of a co-located NFC reader according to an implementation of the disclosed subject matter.

FIG. 4 shows an example third conductive layer and substrate view of a co-located NFC reader according to an implementation of the disclosed subject matter. The third conductive layer 400 of the multilayer PCB for the device 100 may include traces 410. The traces 410 may cross the bridges 130 formed on the third substrate layer 300, connecting circuitry and electronics from the inner PCB section 120 to the circuitry and electronics on the outer PCB section 110, allowing for the transmission of electricity, and electronic signals, across the gap 160. For example, signals from the contact pads 170 on top conductive layer 200 of the inner PCB section 120 may be routed through the inner PCB section 120 from the top conductive layer 200 to the third conductive layer 400, where they may then be carried across the gap 160 by the traces 410. The traces 410 may be oriented on the bridges 130 so that the traces 410 are at or near right angles with the NFC antenna 140.

The traces 410 may be formed on the bridges 130 of third substrate layer 300 from the same conductive material as the third conductive layer 400 of the multilayer PCB. The traces 410 may be integral to the third conductive layer 400 of the inner PCB section 120 and the outer PCB section 110, which may all be formed from the same piece of conductive material. The bridges 130 may also include an additional substrate or core layer. For example, the traces 410 may be in between the third substrate layer 300 and an additional substrate or core layer, which may be the second substrate layer. For example, the third substrate layer 300 may be between the third conductive layer 300 and the fourth conductive layer of the multilayer PCB. The second substrate layer may be between the third conductive layer 300 and the second conductive layer of the multilayer PCB. The traces 410 may be in between bridges 130 formed from the third substrate layer 300 and the second substrate layer.

The multilayer PCB of the device 100 may include additional conductive, substrate, and core layers beyond the third conductive layer 300. Additional bridges 130 may be formed on the additional substrate and core layers, with additional traces 410 on the conductive layers routed across the additional bridges 130. The additional conductive layers may also include additional electronics and circuitry on both the inner PCB section 120 and the outer PCB section 110. Traces may be routed from the electronics and circuitry for the electronic device on the inner PCB section 120, such as the contact pads 170, to electronics and circuitry on various layers of the inner PCB section 120 and the outer PCB section 110 in any suitable manner, using the traces 410 on the bridges 130 to cross the gap 160 as necessary for proper routing. The additional bridges 130, and additional traces 410, on the various layers of the multilayer PCB for the device 100 may be arranged so that they do not substantially cover the gap 160. The inner PCB section 120 may be congruent on each layer, or may have a different shape on various layers, which may result in the gap 160 have a various shapes on various layers. The outer PCB section 110 also may be congruent on each layer, or may have a different shape on various layers, which may result in the gap 160 have a various shapes on various layers.

Figure 5:
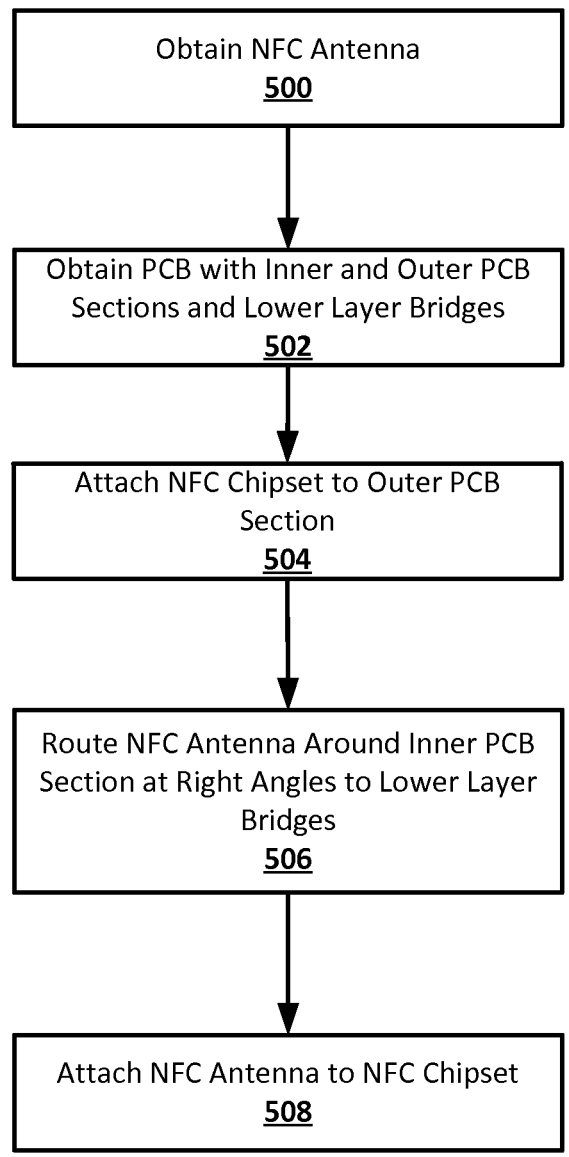
FIG. 5 shows an example of a process for assembling a co-located NFC reader according to an implementation of the disclosed subject matter.

FIG. 5 shows an example of a process for assembling a co-located NFC reader according to an implementation of the disclosed subject matter. At 500, an NFC antenna may be obtained. For example, the NFC antenna 140, which may be a loop antenna for use with an NFC reader, may be obtained.

At 502, a PCB with an inner and outer section and lower layer bridges may be obtained. For example, the multilayer PCB for the device 100, including the inner PCB section 120, electronics and circuitry for an electronic device on the inner PCB section 120 of the top conductive layer 200, additional electronics and circuitry on lower layers of the inner PCB section 120, the outer PCB section 110 including electronics and circuitry for use with the electronic device on various layers, the gap 160 separating the inner PCB section 120 and the outer PCB section 110 of the top conductive layer 200, and the bridges 130 crossing the gap 160 on lower layers, such as the third substrate layer 300, with the traces 410 crossing the bridges 130, for example, on the third conductive layer 400, may be obtained.

At 504, an NFC chipset may be attached to the outer PCB section. For example, the NFC chipset 150 may be attached to the outer PCB section 110 of the top conductive layer 200. The NFC chipset 150 may be attached during or after the manufacture of the multilayer PCB. The outer PCB section 110 may include traces to the NFC chipset 150 that may carry electricity, and electrical signals, to provide power to and data input and output to and from the NFC chipset 150.

At 506, the NFC antenna may be routed around inner PCB section at right angles to the bridges on the lower layers. For example, the NFC antenna 140 may arranged and routed in the gap 160 around the inner PCB section 120 top conductive layer 200. The NFC antenna 140 may be routed and arranged so that it is at or near a right angle with any of the bridges 130 the NFC antenna 140 intersects in the gap 160. The NFC antenna 140 may be attached to a non-conductive material in the gap 160.

At 508, the NFC antenna may be attached to the NFC chipset. For example, leads from the NFC antenna 140 may be attached to the NFC chipset 150 on the outer PCB section 110 of the top conductive layer 200. The leads from the NFC antenna 140 may include, or be connected to, traces of the outer PCB section 110, or may be connected directly to the NFC chipset 150 separate from the conductive material of the outer PCB section 110. For example, a portion of the conductive material of the outer PCB section 110 of the top conductive layer 200 may be removed, during or after manufacture, so that the leads of the NFC antenna 140 may be placed on the insulating or dielectric substrate and connect to the NFC chipset 150. The NFC antenna 140 and NFC chipset 150 may form an NFC reader, which may co-located with the electronic device of the device 100 on the multilayer PCB.

Embodiments disclosed herein may use one or more sensors. In general, a "sensor" may refer to any device that can obtain information about its environment. Sensors may be described by the type of information they collect. For example, sensor types as disclosed herein may include motion, smoke, carbon monoxide, proximity, temperature, time, physical orientation, acceleration, location, and the like. A sensor also may be described in terms of the particular physical device that obtains the environmental information. For example, an accelerometer may obtain acceleration information, and thus may be used as a general motion sensor and/or an acceleration sensor. A sensor also may be described in terms of the specific hardware components used to implement the sensor. For example, a temperature sensor may include a thermistor, thermocouple, resistance temperature detector, integrated circuit temperature detector, or combinations thereof. In some cases, a sensor may operate as multiple sensor types sequentially or concurrently, such as where a temperature sensor is used to detect a change in temperature, as well as the presence of a person or animal.

In general, a "sensor" as disclosed herein may include multiple sensors or sub-sensors, such as where a position sensor includes both a global positioning sensor (GPS) as well as a wireless network sensor, which provides data that can be correlated with known wireless networks to obtain location information. Multiple sensors may be arranged in a single physical housing, such as where a single device includes movement, temperature, magnetic, and/or other sensors. Such a housing also may be referred to as a sensor or a sensor device. For clarity, sensors are described with respect to the particular functions they perform and/or the particular physical hardware used, when such specification is necessary for understanding of the embodiments disclosed herein.

Figure 7:
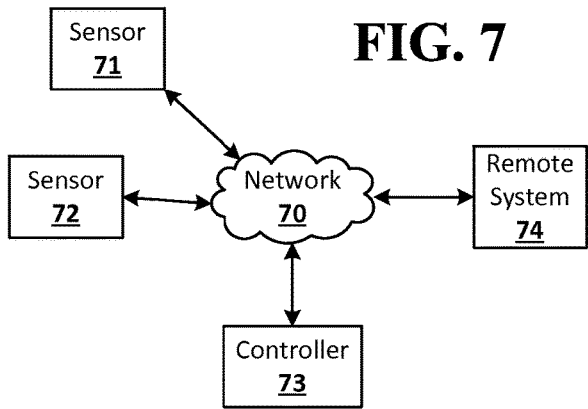
FIG. 7 shows a system according to an embodiment of the disclosed subject matter.

A sensor may include hardware in addition to the specific physical sensor that obtains information about the environment. FIG. 7 shows an example sensor as disclosed herein. The sensor 60 may include an environmental sensor 61, such as a temperature sensor, smoke sensor, carbon monoxide sensor, motion sensor, accelerometer, proximity sensor, passive infrared (PIR) sensor, magnetic field sensor, radio frequency (RF) sensor, light sensor, humidity sensor, or any other suitable environmental sensor, that obtains a corresponding type of information about the environment in which the sensor 60 is located. A processor 64 may receive and analyze data obtained by the sensor 61, control operation of other components of the sensor 60, and process communication between the sensor and other devices. The processor 64 may execute instructions stored on a computer-readable memory 65. The memory 65 or another memory in the sensor 60 may also store environmental data obtained by the sensor 61. A communication interface 63, such as a Wi-Fi or other wireless interface, Ethernet or other local network interface, or the like, may allow for communication by the sensor 60 with other devices. A user interface (UI) 62 may provide information and/or receive input from a user of the sensor. The UI 62 may include, for example, a speaker to output an audible alarm when an event is detected by the sensor 60. Alternatively, or in addition, the UI 62 may include a light to be activated when an event is detected by the sensor 60. The user interface may be relatively minimal, such as a limited-output display, or it may be a full-featured interface such as a touchscreen. Components within the sensor 60 may transmit and receive information to and from one another via an internal bus or other mechanism as will be readily understood by one of skill in the art. One or more components may be implemented in a single physical arrangement, such as where multiple components are implemented on a single integrated circuit. Sensors as disclosed herein may include other components, and/or may not include all of the illustrative components shown.

Sensors as disclosed herein may operate within a communication network, such as a conventional wireless network, and/or a sensor-specific network through which sensors may communicate with one another and/or with dedicated other devices. In some configurations one or more sensors may provide information to one or more other sensors, to a central controller, or to any other device capable of communicating on a network with the one or more sensors. A central controller may be general- or special-purpose. For example, one type of central controller is a home automation network that collects and analyzes data from one or more sensors within the home. Another example of a central controller is a special-purpose controller that is dedicated to a subset of functions, such as a security controller that collects and analyzes sensor data primarily or exclusively as it relates to various security considerations for a location. A central controller may be located locally with respect to the sensors with which it communicates and from which it obtains sensor data, such as in the case where it is positioned within a home that includes a home automation and/or sensor network. Alternatively or in addition, a central controller as disclosed herein may be remote from the sensors, such as where the central controller is implemented as a cloud-based system that communicates with multiple sensors, which may be located at multiple locations and may be local or remote with respect to one another.

Figure 6:
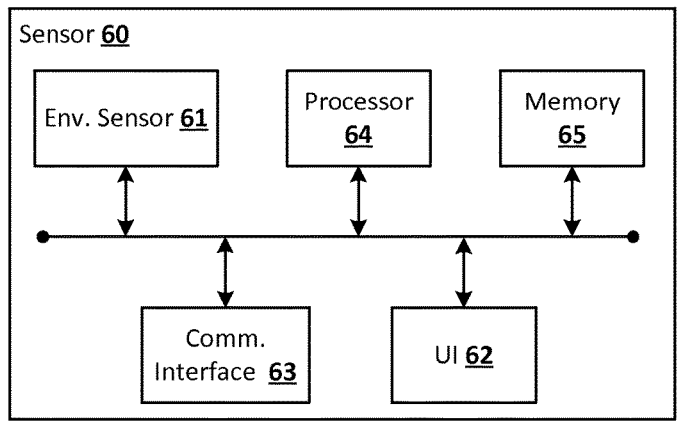
FIG. 6 shows a computing device according to an embodiment of the disclosed subject matter.

FIG. 6 shows an example of a sensor network as disclosed herein, which may be implemented over any suitable wired and/or wireless communication networks. One or more sensors 71, 72 may communicate via a local network 70, such as a Wi-Fi or other suitable network, with each other and/or with a controller 73. The controller may be a general- or special-purpose computer. The controller may, for example, receive, aggregate, and/or analyze environmental information received from the sensors 71, 72. The sensors 71, 72 and the controller 73 may be located locally to one another, such as within a single dwelling, office space, building, room, or the like, or they may be remote from each other, such as where the controller 73 is implemented in a remote system 74 such as a cloud-based reporting and/or analysis system. Alternatively or in addition, sensors may communicate directly with a remote system 74. The remote system 74 may, for example, aggregate data from multiple locations, provide instruction, software updates, and/or aggregated data to a controller 73 and/or sensors 71, 72.

The sensor network shown in FIG. 7 may be an example of a smart-home environment. The depicted smart-home environment may include a structure, a house, office building, garage, mobile home, or the like. The devices of the smart home environment, such as the sensors 71, 72, the controller 73, and the network 70 may be integrated into a smart-home environment that does not include an entire structure, such as an apartment, condominium, or office space.

The smart home environment can control and/or be coupled to devices outside of the structure. For example, one or more of the sensors 71, 72 may be located outside the structure, for example, at one or more distances from the structure (e.g., sensors 71, 72 may be disposed outside the structure, at points along a land perimeter on which the structure is located, and the like. One or more of the devices in the smart home environment need not physically be within the structure. For example, the controller 73 which may receive input from the sensors 71, 72 may be located outside of the structure.

The structure of the smart-home environment may include a plurality of rooms, separated at least partly from each other via walls. The walls can include interior walls or exterior walls. Each room can further include a floor and a ceiling. Devices of the smart-home environment, such as the sensors 71, 72, may be mounted on, integrated with and/or supported by a wall, floor, or ceiling of the structure.

The smart-home environment including the sensor network shown in FIG. 7 may include a plurality of devices, including intelligent, multi-sensing, network-connected devices that can integrate seamlessly with each other and/or with a central server or a cloud-computing system (e.g., controller 73 and/or remote system 74) to provide home-security and smart-home features. The smart-home environment may include one or more intelligent, multi-sensing, network-connected thermostats (e.g., "smart thermostats"), one or more intelligent, network-connected, multi-sensing hazard detection units (e.g., "smart hazard detectors"), and one or more intelligent, multi-sensing, network-connected entryway interface devices (e.g., "smart doorbells"). The smart hazard detectors, smart thermostats, and smart doorbells may be the sensors 71, 72 shown in FIG. 7.

According to embodiments of the disclosed subject matter, the smart thermostat may detect ambient climate characteristics (e.g., temperature and/or humidity) and may control an HVAC (heating, ventilating, and air conditioning) system accordingly of the structure. For example, the ambient client characteristics may be detected by sensors 71, 72 shown in FIG. 7, and the controller 73 may control the HVAC system (not shown) of the structure.

A smart hazard detector may detect the presence of a hazardous substance or a substance indicative of a hazardous substance (e.g., smoke, fire, or carbon monoxide). For example, smoke, fire, and/or carbon monoxide may be detected by sensors 71, 72 shown in FIG. 7, and the controller 73 may control an alarm system to provide a visual and/or audible alarm to the user of the smart-home environment.

A smart doorbell may control doorbell functionality, detect a person's approach to or departure from a location (e.g., an outer door to the structure), and announce a person's approach or departure from the structure via audible and/or visual message that is output by a speaker and/or a display coupled to, for example, the controller 73.

In some embodiments, the smart-home environment of the sensor network shown in FIG. 7 may include one or more intelligent, multi-sensing, network-connected wall switches (e.g., "smart wall switches"), one or more intelligent, multi-sensing, network-connected wall plug interfaces (e.g., "smart wall plugs"). The smart wall switches and/or smart wall plugs may be the sensors 71, 72 shown in FIG. 7. The smart wall switches may detect ambient lighting conditions, and control a power and/or dim state of one or more lights. For example, the sensors 71, 72, may detect the ambient lighting conditions, and the controller 73 may control the power to one or more lights (not shown) in the smart-home environment. The smart wall switches may also control a power state or speed of a fan, such as a ceiling fan. For example, sensors 72, 72 may detect the power and/or speed of a fan, and the controller 73 may adjusting the power and/or speed of the fan, accordingly. The smart wall plugs may control supply of power to one or more wall plugs (e.g., such that power is not supplied to the plug if nobody is detected to be within the smart-home environment). For example, one of the smart wall plugs may controls supply of power to a lamp (not shown).

In embodiments of the disclosed subject matter, the smart-home environment may include one or more intelligent, multi-sensing, network-connected entry detectors (e.g., "smart entry detectors"). The sensors 71, 72 shown in FIG. 7 may be the smart entry detectors. The illustrated smart entry detectors (e.g., sensors 71, 72) may be disposed at one or more windows, doors, and other entry points of the smart-home environment for detecting when a window, door, or other entry point is opened, broken, breached, and/or compromised. The smart entry detectors may generate a corresponding signal to be provided to the controller 73 and/or the remote system 74 when a window or door is opened, closed, breached, and/or compromised. In some embodiments of the disclosed subject matter, the alarm system, which may be included with controller 73 and/or coupled to the network 70 may not arm unless all smart entry detectors (e.g., sensors 71, 72) indicate that all doors, windows, entryways, and the like are closed and/or that all smart entry detectors are armed.

The smart-home environment of the sensor network shown in FIG. 7 can include one or more intelligent, multi-sensing, network-connected doorknobs (e.g., "smart doorknob"). For example, the sensors 71, 72 may be coupled to a doorknob of a door (e.g., doorknobs 122 located on external doors of the structure of the smart-home environment). However, it should be appreciated that smart doorknobs can be provided on external and/or internal doors of the smart-home environment.

The smart thermostats, the smart hazard detectors, the smart doorbells, the smart wall switches, the smart wall plugs, the smart entry detectors, the smart doorknobs, the keypads, and other devices of the smart-home environment (e.g., as illustrated as sensors 71, 72 of FIG. 7 can be communicatively coupled to each other via the network 70, and to the controller 73 and/or remote system 74 to provide security, safety, and/or comfort for the smart home environment).

A user can interact with one or more of the network-connected smart devices (e.g., via the network 70). For example, a user can communicate with one or more of the network-connected smart devices using a computer (e.g., a desktop computer, laptop computer, tablet, or the like) or other portable electronic device (e.g., a smartphone, a tablet, a key FOB, and the like). A webpage or application can be configured to receive communications from the user and control the one or more of the network-connected smart devices based on the communications and/or to present information about the device's operation to the user. For example, the user can view can arm or disarm the security system of the home.

One or more users can control one or more of the network-connected smart devices in the smart-home environment using a network-connected computer or portable electronic device. In some examples, some or all of the users (e.g., individuals who live in the home) can register their mobile device and/or key FOBs with the smart-home environment (e.g., with the controller 73). Such registration can be made at a central server (e.g., the controller 73 and/or the remote system 74) to authenticate the user and/or the electronic device as being associated with the smart-home environment, and to provide permission to the user to use the electronic device to control the network-connected smart devices and the security system of the smart-home environment. A user can use their registered electronic device to remotely control the network-connected smart devices and security system of the smart-home environment, such as when the occupant is at work or on vacation. The user may also use their registered electronic device to control the network-connected smart devices when the user is located inside the smart-home environment.

Alternatively, or in addition to registering electronic devices, the smart-home environment may make inferences about which individuals live in the home and are therefore users and which electronic devices are associated with those individuals. As such, the smart-home environment "learns" who is a user (e.g., an authorized user) and permits the electronic devices associated with those individuals to control the network-connected smart devices of the smart-home environment (e.g., devices communicatively coupled to the network 70). Various types of notices and other information may be provided to users via messages sent to one or more user electronic devices. For example, the messages can be sent via email, short message service (SMS), multimedia messaging service (MMS), unstructured supplementary service data (USSD), as well as any other type of messaging services and/or communication protocols.

The smart-home environment may include communication with devices outside of the smart-home environment but within a proximate geographical range of the home. For example, the smart-home environment may include an outdoor lighting system (not shown) that communicates information through the communication network 70 or directly to a central server or cloud-computing system (e.g., controller 73 and/or remote system 74) regarding detected movement and/or presence of people, animals, and any other objects and receives back commands for controlling the lighting accordingly.

The controller 73 and/or remote system 74 can control the outdoor lighting system based on information received from the other network-connected smart devices in the smart-home environment. For example, in the event, any of the network-connected smart devices, such as smart wall plugs located outdoors, detect movement at night time, the controller 73 and/or remote system 74 can activate the outdoor lighting system and/or other lights in the smart-home environment.

Figure 8:
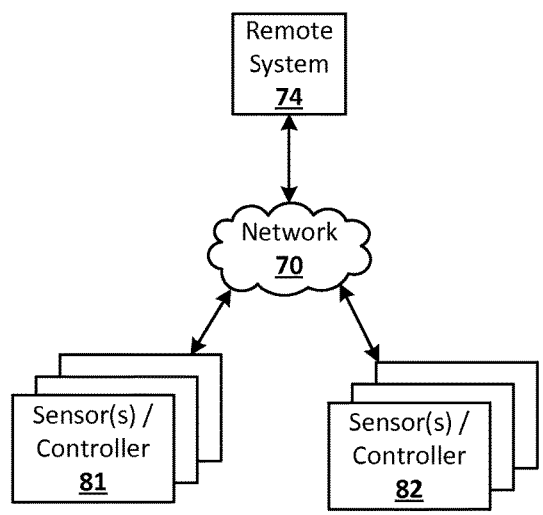
FIG. 8 shows a system according to an embodiment of the disclosed subject matter.

In some configurations, a remote system 74 may aggregate data from multiple locations, such as multiple buildings, multi-resident buildings, individual residences within a neighborhood, multiple neighborhoods, and the like. FIG. 8 shows a system according to an embodiment of the disclosed subject matter. In general, multiple sensor/controller systems 81, 82 as previously described with respect to FIG. 7 may provide information to the remote system 74. The systems 81, 82 may provide data directly from one or more sensors as previously described, or the data may be aggregated and/or analyzed by local controllers such as the controller 73, which then communicates with the remote system 74. The remote system may aggregate and analyze the data from multiple locations, and may provide aggregate results to each location. For example, the remote system 74 may examine larger regions for common sensor data or trends in sensor data, and provide information on the identified commonality or environmental data trends to each local system 81, 82.

In situations in which the systems discussed here collect personal information about users, or may make use of personal information, the users may be provided with an opportunity to control whether programs or features collect user information (e.g., information about a user's social network, social actions or activities, profession, a user's preferences, or a user's current location), or to control whether and/or how to receive content from the content server that may be more relevant to the user. In addition, certain data may be treated in one or more ways before it is stored or used, so that personally identifiable information is removed. As another example, systems disclosed herein may allow a user to restrict the information collected by those systems to applications specific to the user, such as by disabling or limiting the extent to which such information is aggregated or used in analysis with other information from other users. Thus, the user may have control over how information is collected about the user and used by a system as disclosed herein.

Figure 9:
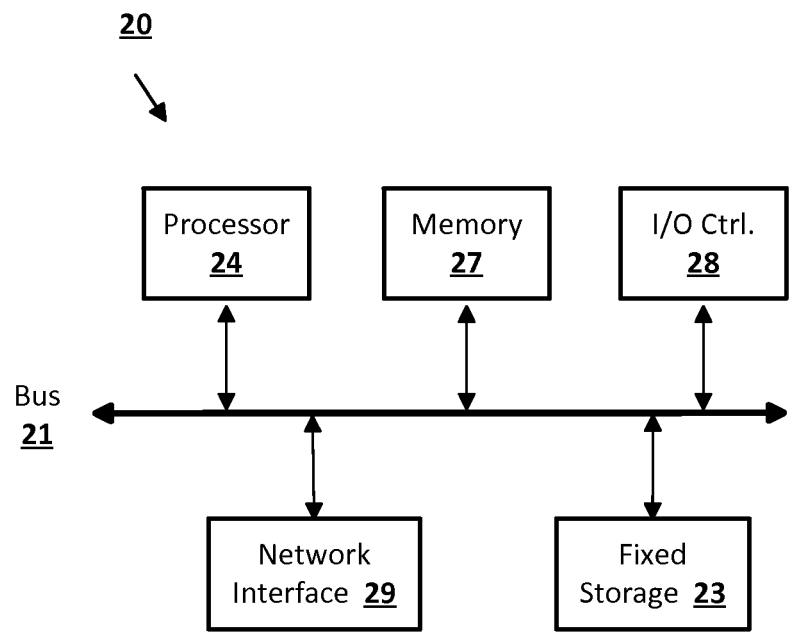
FIG. 9 shows a computer according to an embodiment of the disclosed subject matter.

Embodiments of the presently disclosed subject matter may be implemented in and used with a variety of computing devices. FIG. 9 is an example computing device 20 suitable for implementing embodiments of the presently disclosed subject matter. For example, the device 20 may be used to implement a controller, a device including sensors as disclosed herein, or the like. Alternatively or in addition, the device 20 may be, for example, a desktop or laptop computer, or a mobile computing device such as a smart phone, tablet, or the like. The device 20 may include a bus 21 which interconnects major components of the computer 20, such as a central processor 24, a memory 27 such as Random Access Memory (RAM), Read Only Memory (ROM), flash RAM, or the like, a user display 22 such as a display screen, a user input interface 26, which may include one or more controllers and associated user input devices such as a keyboard, mouse, touch screen, and the like, a fixed storage 23 such as a hard drive, flash storage, and the like, a removable media component 25 operative to control and receive an optical disk, flash drive, and the like, and a network interface 29 operable to communicate with one or more remote devices via a suitable network connection.

The bus 21 allows data communication between the central processor 24 and one or more memory components 25, 27, which may include RAM, ROM, and other memory, as previously noted. Applications resident with the computer 20 are generally stored on and accessed via a computer readable storage medium.

The fixed storage 23 may be integral with the computer 20 or may be separate and accessed through other interfaces. The network interface 29 may provide a direct connection to a remote server via a wired or wireless connection. The network interface 29 may provide such connection using any suitable technique and protocol as will be readily understood by one of skill in the art, including digital cellular telephone, WiFi, Bluetooth®, near-field, and the like. For example, the network interface 29 may allow the device to communicate with other computers via one or more local, wide-area, or other communication networks, as described in further detail herein.

The foregoing description, for purpose of explanation, has been described with reference to specific embodiments. However, the illustrative discussions above are not intended to be exhaustive or to limit embodiments of the disclosed subject matter to the precise forms disclosed. Many modifications and variations are possible in view of the above teachings. The embodiments were chosen and described in order to explain the principles of embodiments of the disclosed subject matter and their practical applications, to thereby enable others skilled in the art to utilize those embodiments as well as various embodiments with various modifications as may be suited to the particular use contemplated.

The invention claimed is:

1. A device comprising:
a top conductive layer of a printed circuit board (PCB), the top conductive layer comprising an inner PCB section and an outer PCB section separated by a gap such that the inner PCB section of the top conductive layer does not touch the outer PCB section of the top conductive layer and the outer PCB section of the top conductive layer surrounds the inner PCB section of the top conductive layer;
a circuit for an electronic device disposed on the inner PCB section of the top conductive layer;
a near-field communications (NFC) chipset disposed on the outer PCB section of the top conductive layer;
a substrate layer of the PCB, the substrate layer comprising an inner PCB section and an outer PCB section separated by the gap;
a bridge crossing the gap between the inner PCB section of the substrate layer and the outer PCB section of the substrate layer;
a lower conductive layer of the PCB, the lower conductive layer comprising an inner PCB section and an outer PCB section separated by the gap;
a circuit for the electronic device disposed on the inner PCB section of the lower conductive layer and electrically connected to the circuit for the electronic device disposed on the inner PCB section of the top conductive layer;
a circuit for the electronic device disposed on the outer PCB section of the lower conductive layer;
a trace disposed on the bridge and electrically connecting the circuit for the electronic device disposed on the inner PCB section of the lower conductive layer with the circuit for the electronic device disposed on the outer PCB section of the lower conductive layer; and
an NFC antenna disposed in the gap that separates the inner PCB section of the top conductive layer and the outer PCB section of the top conductive layer such that the NFC antenna crosses over the bridge at an angle that is at or near a right angle and is connected to the NFC chipset to form an NFC reader that surrounds inner PCB section of the top conductive layer.

2. The device of claim 1, wherein electronic device is a keypad, touchscreen, non-touchscreen, fingerprint reader, active infrared sensor, or speaker.

3. The device of claim 1, wherein the circuit for the electronic device disposed on the inner PCB section of the top conductive layer is a contact pad for a keypad.

4. The device of claim 1, wherein the substrate layer is a third substrate layer of a multilayer PCB.

5. The device of claim 1, further comprising one other substrate layer, wherein the lower conductive layer is disposed between the substrate layer and the one other substrate layer, and wherein the bridge comprises material of the substrate layer and the one other substrate layer.

6. The device of claim 5, wherein the trace is disposed on the bridge in between the material of the substrate layer and the one other substrate layer.

7. The device of claim 1, wherein the outer PCB section of the top conductive layer further comprises at least one circuit for the NFC chipset.

8. The device of claim 7, wherein the at least one circuit for the NFC chipset comprises a circuit connected to leads of the NFC antenna.

9. The device of claim 1, wherein the outer PCB section of the lower conductive layer comprises at least one circuit for the NFC chipset that is electrically connected to the NFC chipset.

10. The device of claim 1, further comprising at least one additional bridge and at least one additional trace disposed on the at least one additional bridge.

11. A device comprising:
a multilayer PCB comprising:
a top conductive layer comprising an inner section and outer section separated by a gap such that the inner section of the top conductive layer does not touch the outer section of the top conductive layer, and the outer section of the top conductive layer surrounds the inner section of the top conductive layer;
a second conductive layer;
a third conductive layer;

a first substrate layer disposed between the top conductive layer and the second conductive layer;

a second substrate layer disposed between the second conductive layer and the third conductive layer, each of the top conductive layer, the second conductive layer, the third conductive layer, the first substrate layer, and the second substrate layer comprising an inner section and an outer section separated by a gap;

a circuit for an electronic device disposed on the inner section of the top conductive layer;

an NFC chipset for an NFC reader disposed on the outer section of the top conductive layer;

a circuit for the electronic device disposed on the inner section of the third conductive layer and electrically connected to the circuit for the electronic device disposed on the inner section of the top conductive layer;

a circuit for the electronic device disposed on the outer section of the third conductive layer;

a bridge connecting the inner section of the second substrate layer to the outer section of the second substrate layer across the gap;

a trace disposed on the bridge and electrically connecting the circuit for the electronic device disposed on the inner section of the third conductive layer to the circuit for the electronic device disposed on the outer section of the third conductive layer; and an NFC antenna for an NFC reader disposed in the gap that separates the inner section of the top conductive layer and the outer section of the top conductive layer such that an angle at which the NFC antenna intersects the bridge is at or near a right angle, the NFC antenna connected to the NFC chipset such that the NFC antenna and NFC chipset that surround the inner section of the top conductive layer.

12. The device of claim 11, wherein electronic device is a keypad, touchscreen, non-touchscreen, fingerprint reader, or speaker.

13. The device of claim 11, wherein the circuit for the electronic device disposed on the inner section of the top conductive layer is a contact pad for a keypad.

14. The device of claim 11, further comprising:
a circuit for the electronic device disposed on the inner section of the second conductive layer and electrically connected to the circuit for the electronic device disposed on the inner section of the top conductive layer;
a circuit for the electronic device disposed on the outer section of the second conductive layer; and
a second trace disposed on the bridge and electrically connecting the circuit for the electronic device disposed on the inner section of the second conductive layer to the circuit for the electronic device disposed on the outer section of the second conductive layer.

15. The device of claim 14, wherein the bridge further comprises material of the first substrate layer connecting the inner section of the second substrate layer to the outer section of the first substrate layer.

16. The device of claim 11, further comprising a third substrate layer comprising an inner section and outer section separated by the gap, wherein the third conductive layer is in between the third substrate layer and the second substrate layer, and wherein the bridge further comprises material of the third substrate layer connecting the inner section of the third substrate layer to the outer section of the third substrate layer.

17. The device of claim 16, further comprising:
a fourth conductive layer comprising an inner section and outer section separated by the gap, wherein the third substrate layer is in between the fourth conductive layer and the third conductive layer;
a second bridge connecting the inner section of the third substrate layer to the outer section of the third substrate layer across the gap; and
a second trace disposed on the second bridge and electrically connecting a circuit for the electronic device disposed on the inner section of the fourth conductive layer to a circuit for the electronic device disposed on the outer section of the fourth substrate layer.

18. The device of claim 17, wherein the circuit for the electronic device disposed on the inner section of the fourth conductive layer is electrically connected to the circuit for the electronic device disposed on the inner section of the top conductive layer.

19. The device of claim 11, wherein the outer section of one or more of the top conductive layer, the second conductive layer, and the third conductive layer further comprises at least one circuit for the NFC chipset.

20. A method comprising:
obtaining an NFC antenna;
obtaining a multilayer PCB wherein each layer of the multilayer PCB comprises an inner section and an outer section separated by a gap and wherein an inner section of a top conductive layer does not touch an outer section of the top conductive layer and the outer section of the top conductive layer surrounds the inner section of the top conductive layer, the top conductive layer of the multilayer PCB comprises at least one circuit for an electronic device, at least one substrate layer of the multilayer PCB comprises a bridge connecting the inner section and outer section of the substrate layer, and at least one conductive layer of the multilayer PCB comprises a trace disposed on the bridge and electrically connecting the at least one circuit for the electronic device on the inner section of the top conductive layer to at least one other circuit for the electronic device on the outer section of the at least one conductive layer;
attaching an NFC chipset to the outer section of the top conductive layer of the multilayer PCB;
routing an NFC antenna in the gap between the inner section and the outer section of the top conductive layer of the multilayer PCB such that the angle where NFC antenna intersects the bridge is at or a near a right angle; and
attaching the NFC antenna to the NFC chipset to form an NFC reader that surrounds the inner section of the top conductive layer.

* * * * *